(12) United States Patent
Chan et al.

(10) Patent No.: US 6,353,366 B1
(45) Date of Patent: Mar. 5, 2002

(54) BANDWIDTH ENHANCEMENT OF TRANSIMPEDANCE AMPLIFIER BY CAPACITIVE PEAKING DESIGN

(75) Inventors: Yi-Jen Chan, Chungli; Feng-Tso Chien, Taichung; Tien-Tsorng Shin; Wen-Jeng Ho, both of Taoyuan, all of (TW)

(73) Assignees: Telecommunications Laboratories; Chunghwa Telecom Co., Ltd., both of (TW)

( * ) Notice: Subject to any disclaimer, the term of this patent is extended or adjusted under 35 U.S.C. 154(b) by 0 days.

(21) Appl. No.: 09/559,584

(22) Filed: Apr. 28, 2000

(51) Int. Cl.[7] ................................................. H03F 3/04
(52) U.S. Cl. ....................................... 330/305; 330/107
(58) Field of Search ................................... 330/305, 107

(56) References Cited

U.S. PATENT DOCUMENTS

| | | | | |
|---|---|---|---|---|
| 5,307,024 A | * | 4/1994 | Metz et al. .................. | 330/259 |
| 5,371,479 A | * | 12/1994 | Hagerty ....................... | 330/294 |
| 5,400,086 A | * | 3/1995 | Sano et al. .................. | 348/678 |
| 5,546,048 A | * | 8/1996 | Sano et al. .................. | 330/263 |
| 5,936,463 A | * | 8/1999 | Shou et al. .................... | 330/9 |

* cited by examiner

*Primary Examiner*—Robert Pascal
*Assistant Examiner*—Henry Choe
(74) *Attorney, Agent, or Firm*—Dougherty & Troxell

(57) ABSTRACT

A bandwidth enhancement method by adding a peaking capacitor to a transimpedance amplifier for creating peaking effect is to add a peaking capacitor to a transimpedance amplifier for obtaining an extra pole that can alter circuit phase and enhance bandwidth of the transimpedance amplifier without changing the framework and DC gain of the original amplifier circuit.

2 Claims, 8 Drawing Sheets

BANDWIDTH ENHANCEMENT OF TRANSIMPEDANCE AMPLIFIER BY CAPACITIVE PEAKING DESIGN

BACKGROUND OF THE INVENTION

1. Field of the Invention

This invention relates to a capacitive peaking method for bandwidth enhancement of transimpedance amplifier, more particularly, to a bandwidth enhancement method that can provoke a transimpedance amplifier to create pole-peaking effect by taking advantage of an extra capacitor.

2. Description of the Prior Art

In a highly developed optical network communication system, message in bulky volume are transmitted from second to second, this can be done so far by using optical elements and a wide-band preamplifier, which is considered a key role in optical signal receivers. In research of advanced techniques or amplifiers for massive data communication, the transimpedance amplifier is one of the preamplifiers occasionally applied in the optic fiber signal transmission.

In the so-called peaking technique of inductive peaking (L-peaking) transimpedance amplifier, an inductor is applied to double the bandwidth when peaking effect occurs in high-frequency band. As shown in FIG. 1, an inductor is used in peaking technique of the present transimpedance amplifier for creating circuit oscillation to cause peaking effect at high-frequency band and broaden bandwidth accordingly. Unfortunately, the area occupied by the inductor is far larger than that by an amplifier to waste space, and the accompanied stray capacitance may degrade the gain of the amplifier.

An optoelectronic receiver consisting of a photodetector and a transimpedance amplifier is used to convert optical signals into electrical signals in the front end of the optical fiber communication, therefore, a high-speed transimpedance amplifier is deemed a key role in design of the optoelectronic integrated circuits. For promoting signal transmission efficiency, this invention is proposed to substitute a capacitor for the inductor to broaden bandwidth of a transimpedance amplifier. The substituted capacitor will not impose any burden to the fabrication process in any way while its insulation layer can protect the circuits on the other hand.

Moreover, the capacitive peaking (C-peaking) method of this invention for bandwidth enhancement of transimpedance amplifier is applicable basing on $\mu$m gate-length technology without changing the existing fabrication process.

SUMMARY OF THE INVENTION

The primary object of this invention is to provide a bandwidth enhancement method that can broaden workable bandwidth by adding a peaking capacitor to a transimpedance amplifier for creating pole-peaking effect, wherein the participated capacitor can provide an extra pole to reduce circuitry phase margin to thereby cause the peaking effect.

Another object of this invention is to provide a bandwidth enhancement method that can broaden workable bandwidth by adding a peaking capacitor to a transimpedance amplifier for creating pole-peaking effect, wherein the capacitive peaking technique is capable of doubling the workable bandwidth of the transimpedance amplifier without sacrificing the low-frequency gain, and further, the small sized capacitor benefits control of chip area.

Yet another object of this invention is to provide a bandwidth enhancement method that can broaden workable bandwidth by adding a peaking capacitor to a transimpedance amplifier for creating pole-peaking effect, wherein a simple method for evaluating capacitance of the peaking capacitor may be applied for design of a widest bandwidth of the transimpedance amplifier instead of doing it by trial-and-error.

A furthermore object of this invention is to provide a bandwidth enhancement method that can broaden workable bandwidth by adding a peaking capacitor to a transimpedance amplifier for creating pole-peaking effect, wherein occupied area of the peaking capacitor is far smaller than that of a peaking inductor as mentioned, and besides, an insulation layer of a MIM capacitor can meanwhile serve for a circuitry protection layer and an anti-reflecting coating layer for a photodetector in optical fiber communication receivers.

The bandwidth enhancement method of this invention is applied to broaden workable bandwidth by adding a peaking capacitor to a transimpedance amplifier for creating pole-peaking effect without changing framework of the original circuit and DC gain of the amplifier.

For more detailed information regarding this invention together with further advantages or features thereof, at least an example of preferred embodiment will be elucidated below with reference to the annexed drawings.

BRIEF DESCRIPTION OF THE DRAWINGS

The related drawings in connection with the detailed description of this invention to be made later are described briefly as follows in which.

DETAILED DESCRIPTION OF THE PREFERRED EMBODIMENT

Basically, a transimpedance amplifier may be considered as a shunt-shunt (current-controlled voltage source) feedback amplifier, which consists of an inverter, a resistive feedback loop, and an output buffer stage. The transfer function of this circuit is given by $$Z_T(s) \equiv \frac{V_{out}}{I_i}(s) = \frac{A(s)}{1 + A(s)\beta(s)} \tag{1}$$

where A(s) is an open-loop transfer function of the transimpedance amplifier, and β(s) is a feedback factor. In the shunt-shunt feedback system, β(s) is defined as:

$$\beta(s) = -\frac{1}{Z_f(s)} = -\frac{1 + sC_f R_f}{R_f} \tag{2}$$

where $R_f$ is the effective feedback resistance, and $C_f$ is the parasitic capacitance associated with $R_f$.

Figure 1:
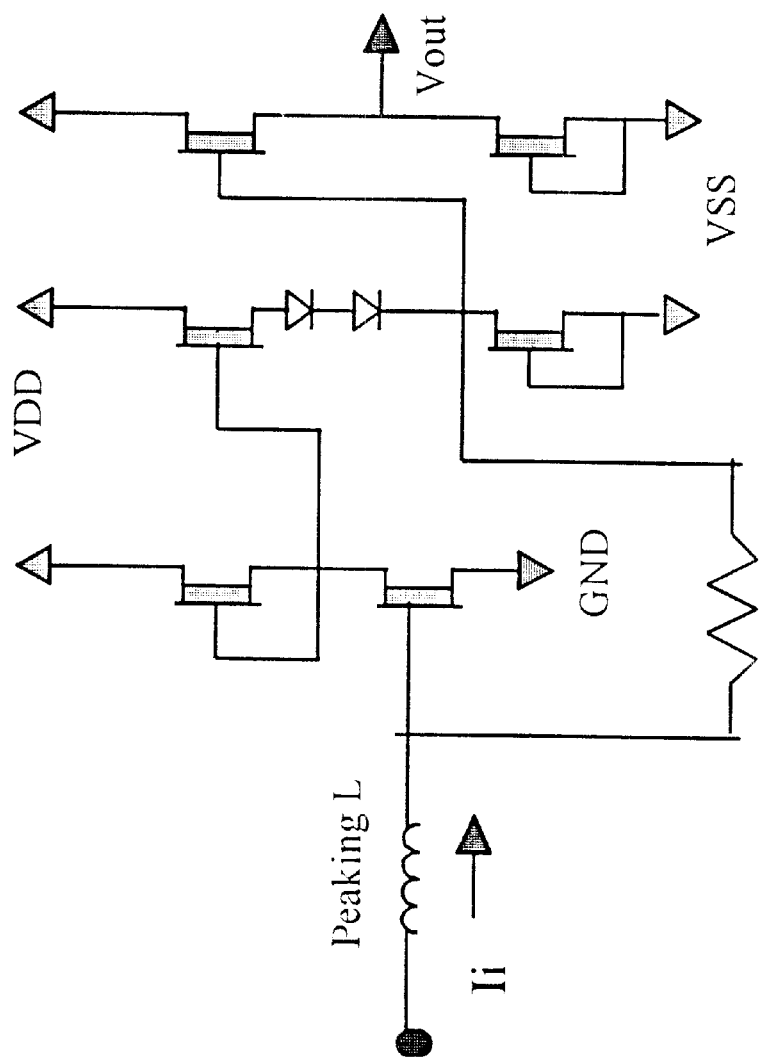
FIG. 1 is a schematic circuit diagram of an inductive peaking amplifier wherein circuit is oscillated by an inductor.
Figure 2:
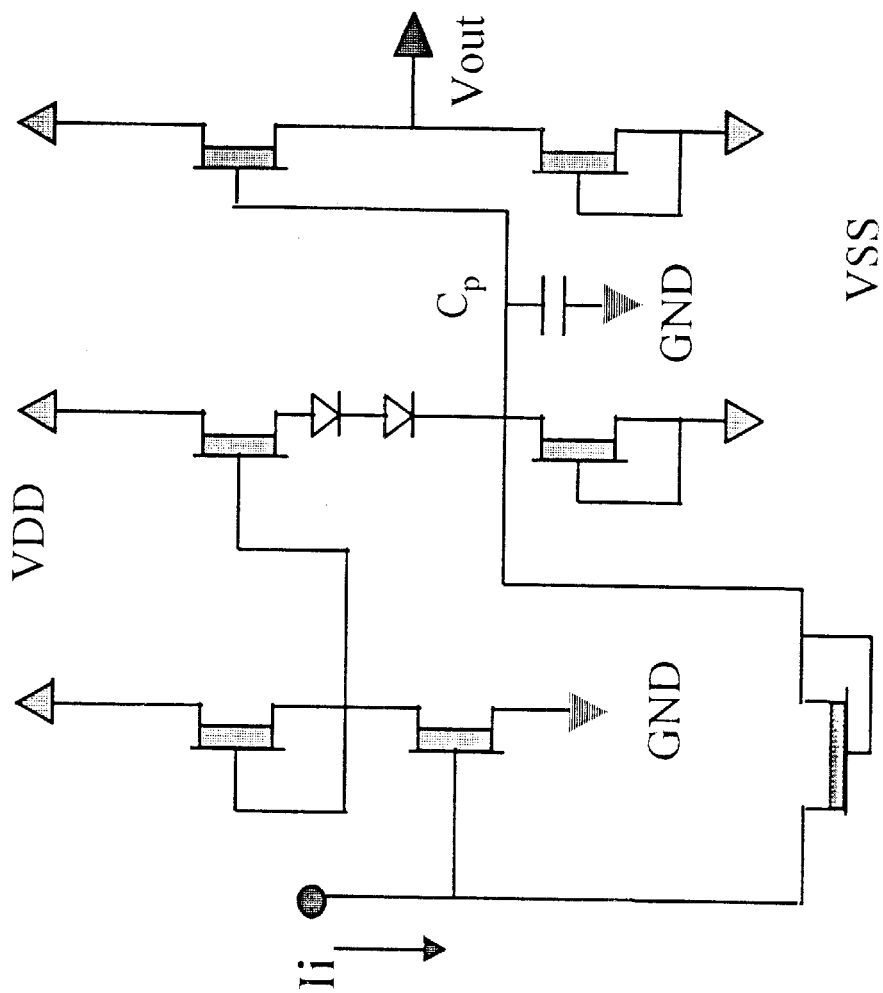
FIG. 2 is a circuit diagram of a transimpedance amplifier with a peaking capacitor that takes advantage of a C-peaking pole effect to broaden the bandwidth.
Figure 3:
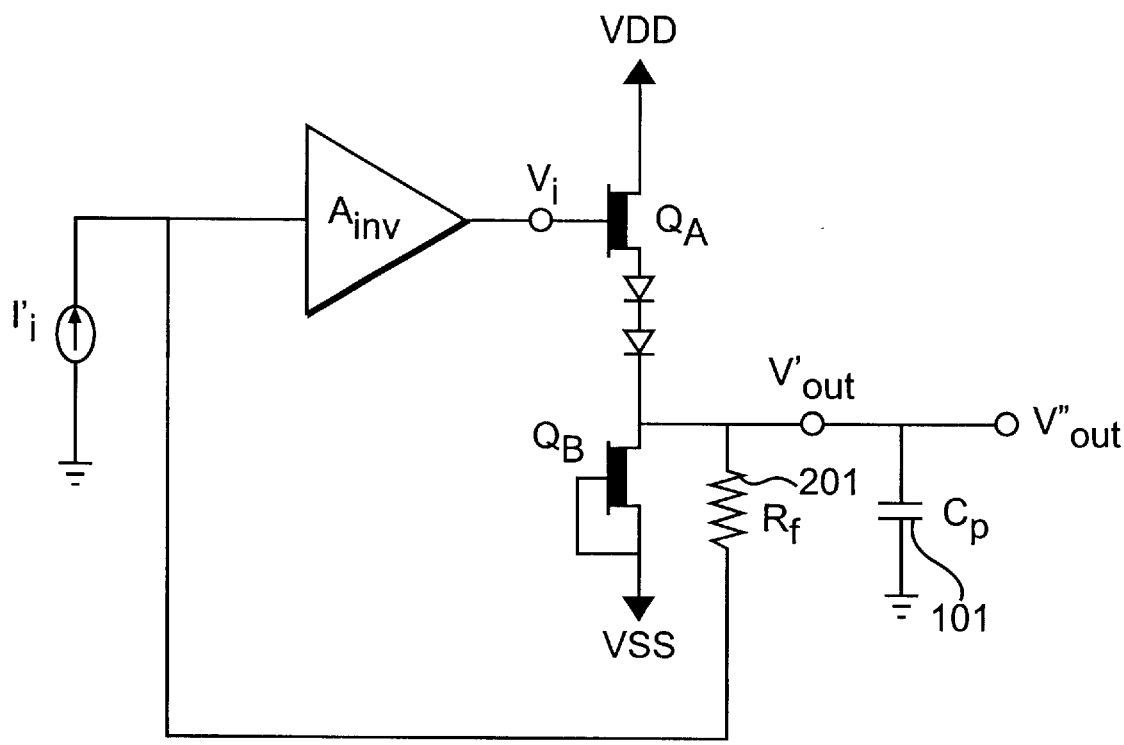
FIG. 3 is an equivalent open-loop circuit diagram of the transimpedance amplifier with a peaking capacitor that takes advantage of a C-peaking effect to broaden the bandwidth.

FIG. 2 shows a schematic circuit of a C-peaking transimpedance amplifier of this invention. For analyzing a peaking effect resulted by a peaking capacitor ($C_P$), we firstly derive the transfer function A(s) without $C_P$ and A'(s) with $C_P$ in the following:

$$A(s) \equiv \frac{V'_{out}}{I'_i}(s) = \frac{V_i}{I'_i} \cdot \frac{V'_{out}}{V_i}(s) = R_f \cdot A_0(s) = \frac{A}{1 + \frac{s}{w_1}} \tag{3}$$

$$A'(s) \equiv \frac{V''_{out}}{I'_i}(s) = \frac{V_i}{I'_i} \cdot \frac{V''_{out}}{V_i}(s) = \frac{A}{\left(1 + \frac{s}{w_1}\right)\left(1 + \frac{s}{w_2}\right)} \tag{4}$$

where A is the open-loop gain of the transimpedance amplifier, $A_0$ is the voltage gain of the inverter. The open-loop gain A approximately equals to $R_f A_0$.

We here assume that the open-loop function A(s) has a single dominant pole $w_1$, then $w_2$ shown in Eq. (4) is an extra pole resulted by the $C_P$ and expressed as:

$$w_2 = \frac{1}{ZC_P} \text{ and} \tag{5}$$

$$Z = R_{ff} // \left(\frac{1}{g_0}\right)_{QA} // \left(\frac{1}{g_0}\right)_{QB} \tag{6}$$

where $(g_0)_{QA}$ and $(g_0)_{QB}$ are output conductance of transistor A and B respectively.

The close-loop transfer function in Eq. (1) without $C_P$ may be rewritten by including Eqs (2) and (3) as:

$$Z_T(s) = \frac{-AR_f}{(A - R_f) + s\left(AR_f C_f - \frac{R_f}{w_1}\right)} = \frac{Z_T(0)}{1 + \frac{s}{w_{3dB}}} \tag{7}$$

where $$w_{3\,dB} \cong (1+A\beta)w_1 = (1+|A_0|)w_1 \tag{8}$$

and where $Z_T(0)$ is the low-frequency transimpedance gain, which can be evaluated as shown in ref.[3], and $w_{3\,dB}$ is the single dominant pole of the transfer function $Z_T(s)$ equal to $(1+|A_0|)w_1$ [6].

Similarly, the close-loop transfer function with the $C_P$ by combining Eqs (2) and (4), we obtain $$Z_{T-C_P}(s) = \frac{\frac{Aw_1 w_2}{(s+w_1)(s+w_2)}}{1 - \left[\frac{Aw_1 w_2}{(s+w_1)(s+w_2)}\right]\left(\frac{1+sR_f C_f}{R_f}\right)} \tag{9-a}$$

$$= \frac{Aw_1 w_2}{s^2 + [(w_1 + w_2) - AC_f w_1 w_2]s + (w_1 w_2 - Aw_1 w_2 / R_f)}$$

$$= \frac{Aw_1 w_2}{s^2 + s\frac{W_0}{Q} + w_0^2} \tag{9-b}$$

From Eq. (9-a), an extra pole can be found in the close-loop transfer function with $C_P$ comparing to the one without $C_P$. For expressing more simply and specifically, Eq. (9-a) can be rewritten in a general form as Eq. (9-b), where $w_0$ is called the pole frequency. The poles in Eq. (9-b) are complex conjugates if Q>0.5, then the bandwidth is broadened due to cancellation of the imaginary parts, however, when it equals to 0.707, it results in a maximum frequency response (Butterworth design), and the peaking effect occurs when Q is greater than 0,707 [4]. It means that we can simply change the value of Q by controlling the value of the $C_P$ to adjust the bandwidth of the transimpedance amplifier.

$Z_{T-C_P}(0)$ can be obtained by setting the frequency to zero in the term $Z_{T-C_P}(s)$, that is:

$$Z_{T-C_P}(0) = \frac{Aw_1 w_2}{w_1 w_2 - Aw_1 w_2 / R_f} = \frac{-R_f}{1 + \frac{1}{|A_0|}} \tag{10}$$

This equation is in the same form with $Z_T(0)$ in ref. [3] indicating that we can widen the bandwidth of the transimpedance amplifier by using the C-peaking technique without sacrificing its low-frequency gain.

By using the C-peaking Butterworth design, we can evaluate an optimum value of the $C_P$ by further derivation of Eq. (9) as the following:

$$w_1 + w_2 - AC_f w_1 w_2 = \frac{w_0}{Q} \tag{11}$$

$$w_0^2 = w_1 w_2 - Aw_1 w_2 / R_f = (1+|A_0|)w_1 w_2 \cong w_{3\,dB} w_2 \tag{12}$$

therefore, $$\frac{\sqrt{w_{3dB} w_2}}{Q} \cong w_1 + w_2 \quad (\Theta\ C_f \to 0)) \tag{13}$$

$$Q = \frac{\sqrt{w_{3dB} w_2}}{w_1 + w_2} = \frac{\sqrt{w_{3dB} w_2}}{\frac{w_{3dB}}{1+|A_0|} + w_2} \tag{14}$$

Based on Eq. (14), $C_P$ can be estimated by Eqs. (5) and (6) as long as the value of $w_2$ is determined, hence, a convenient method for design a Butterworth transimpedance amplifier can be established, wherein the best value of $w_2$ is about 1.5 $w_{3\,dB}$. In other words, basing on the analytical approach of the C-peaking technique, we are able to optimize the 3dB bandwidth of the transimpedance amplifier by selecting a proper $C_P$ value.

In fabrication of our transimpedance amplifier, a GaAs buried-channel MOSFET structure is adopted, and after FETs have been made, they are interconnected in series with Ti/Au alloy wire to form the transimpedance amplifier. Then, a Silicon Nitride ($Si_3N_4$) film is grown on the amplifier circuit by PECVD process serving for an insulation and protection layer. Moreover, in receiver systems, this layer can be used to serve as an anti-reflecting coating layer of photodetectors. Finally, contact windows are opened for probing purpose and a metallic layer is formed on top of a capacitor to have the C-peaking transimpedance amplifier been finalized in an entire area of 900×900 $\mu m^2$, in gate-length of 1 $\mu m$ long for FETs, and 2.5 $\mu m$ for those in a feedback loop.

Figure 4:
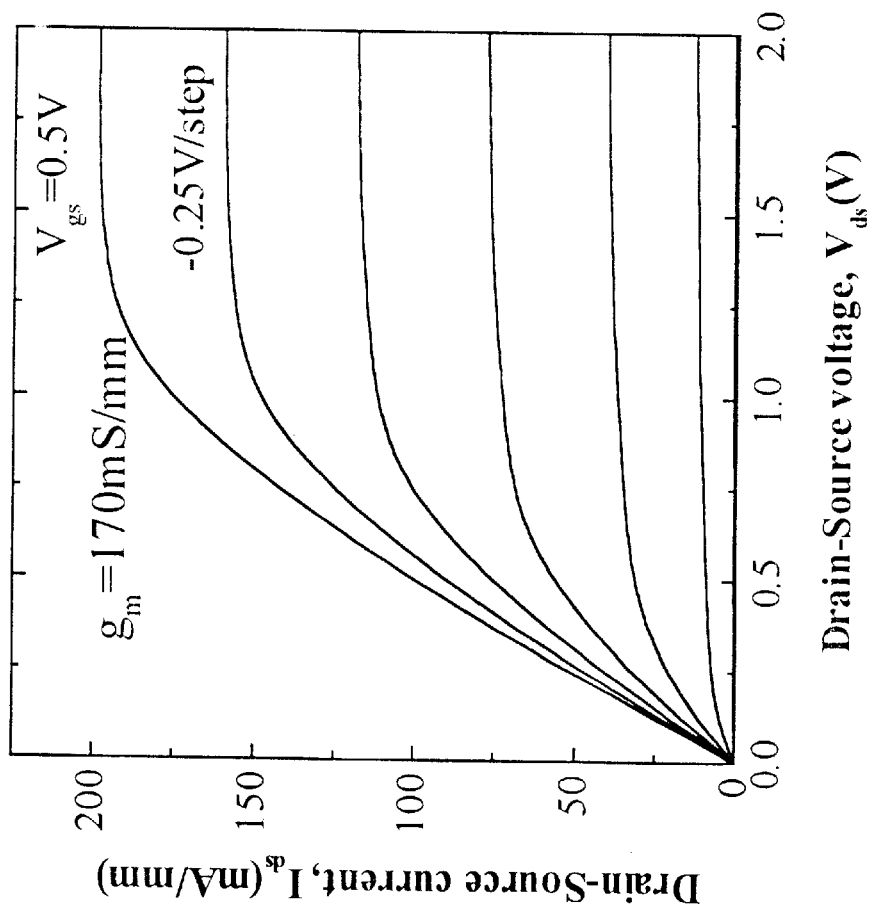
FIG. 4 is a plotted diagram of FET characteristics in the transimpedance amplifier with a peaking capacitor working for widening bandwidth.
Figure 5:
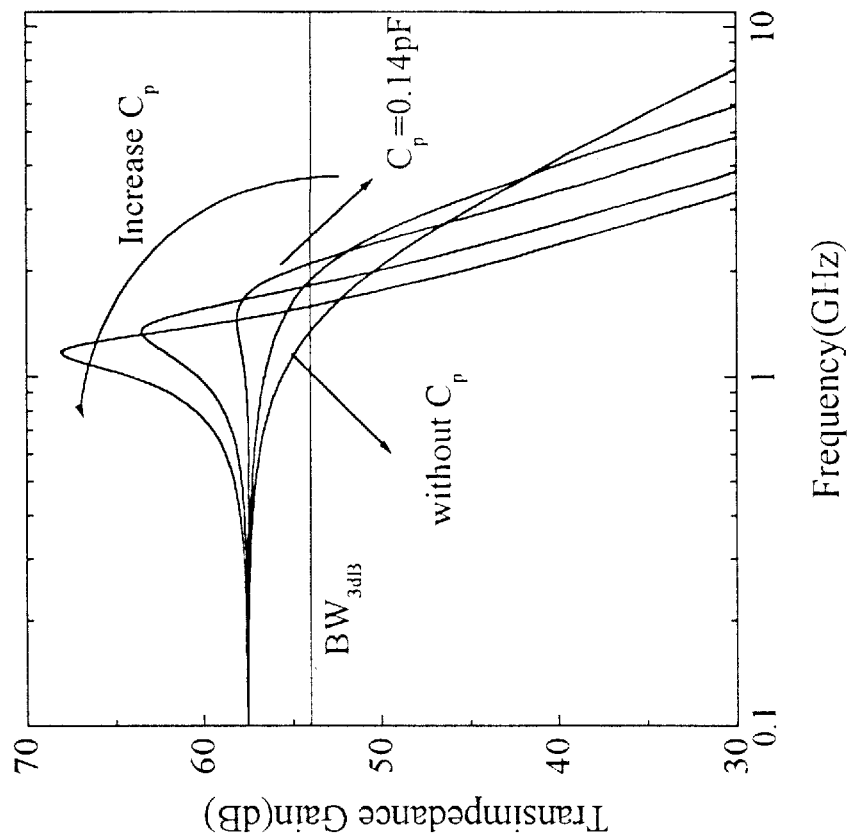
FIG. 5 is a plotted diagram of FET characteristics in the transimpedance amplifier with a peaking capacitor working for widening bandwidth simulated by a SPICE (emulator)

As to the MOSFET electrical characteristics shown in FIG. 4, the peak extrinsic transconductance ($g_m$) of a 1.0 $\mu m$-long gate device is 170 mS/mm at Vds=2V. The measured data have been simulated with a SPICE (emulator) and shown in FIG. 5, from which $C_P$ is found equal to 0.14 pf under the maximum frequency response, i.e., the Butterworth design (Q=0.707), and a 3 dB bandwidth obtained in simulation may be enhanced from 1.2 GHz to 2.2 GHz.

Figure 6:
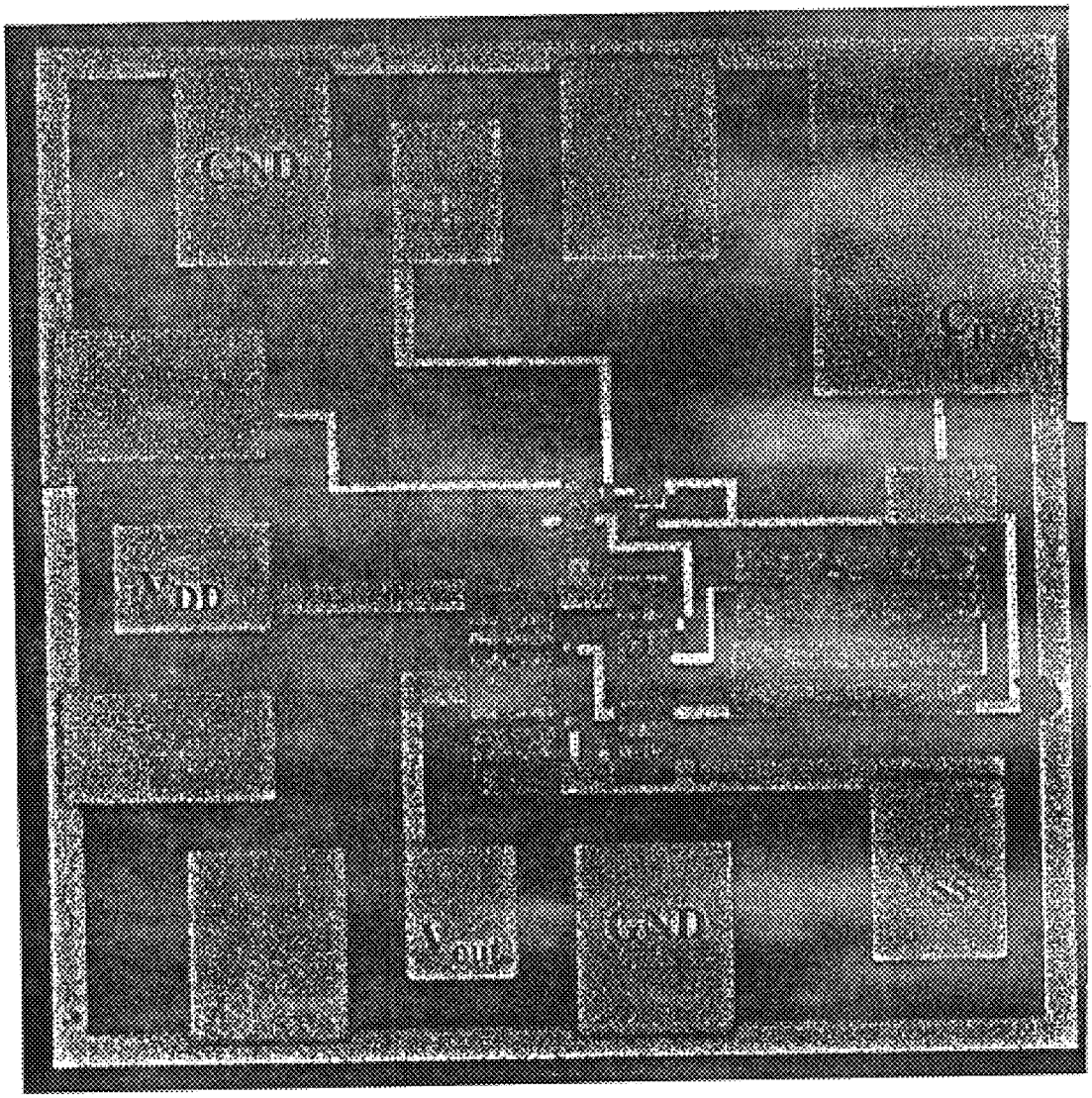
FIG. 6 is a circuit photograph of the transimpedance amplifier with a peaking capacitor working for widening bandwidth.

FIG. 6 shows a photograph of the C-peaking transimpedance amplifier circuit, wherein the $C_P$ is far smaller than those reported previously.

Figure 7:
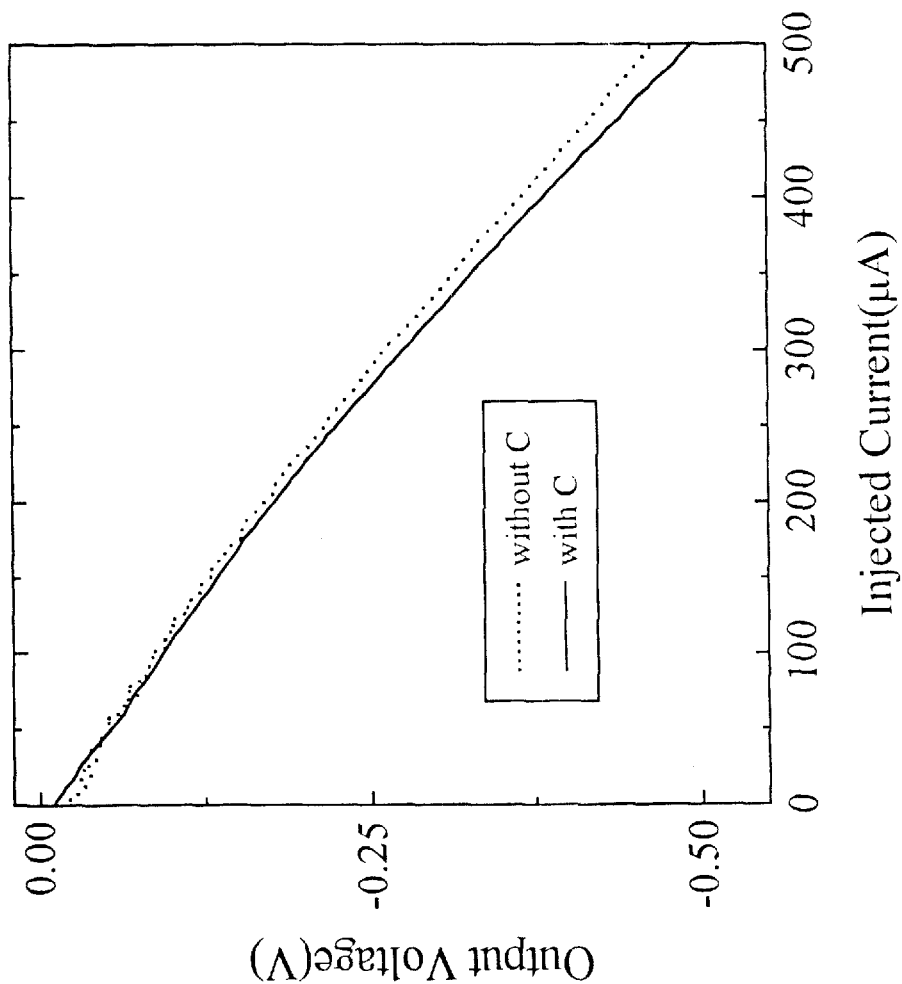
FIG. 7 is a plotted diagram showing DC characteristics of the transimpedance amplifier with a peaking capacitor working for widening bandwidth.

The experimental DC characteristics is shown in FIG. 7, wherein the DC transimpedance gain remains unchanged substantially before and after participation of the $C_P$; the linear transimpedance gain in our circuit is 0.95 K$\Omega$, which may be used for evaluating the $R_f$.

Figure 8:
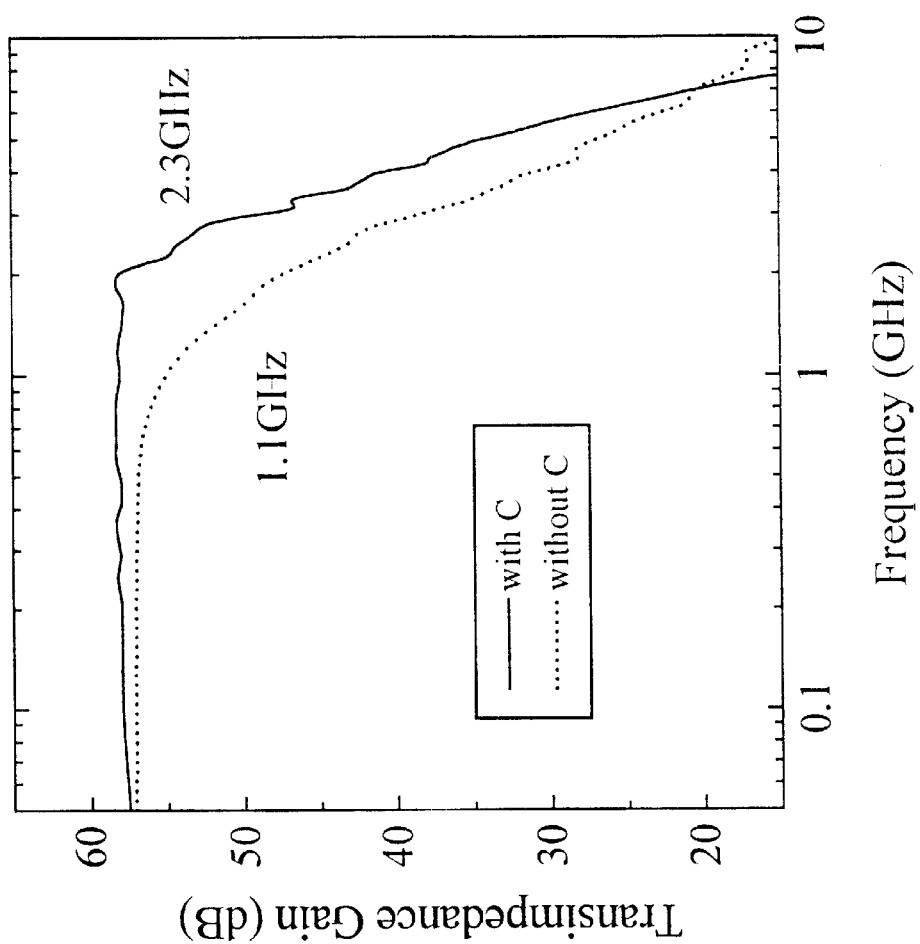
FIG. 8 is a plotted diagram showing high-frequency characteristics of the transimpedance amplifier with a peaking capacitor working for widening bandwidth.

FIG. 8 shows the measured 3 dB bandwidth of the transimpedance amplifier before and after participation of the $C_P$, wherein the 3dB bandwidth of the transimpedance amplifier without $C_P$ is 1.1 GHz, which can be referred as the $w_{3\,dB}$ to enable us to determine a proper value of the $C_P$ for realizing the Butterworth design. The value of Z is 700 $\Omega$ obtained from Eq. (6), and the optimum value of the $C_P$ is 0.14 pf obtained from Eq. (5). These two values create an extra $w_2$ at 1.6 GHz in transfer function for achieving the Butterworth design (Eq. (14)). After $C_P$ is added to this circuit, the 3 dB bandwidth is expanded from 1.1 GHz to 2.3 GHz because of the peaking effect and is quite consistent with simulations.

In short, this invention is to provide a capacitor to a conventional transimpedance amplifier circuit for creating an extra pole to reduce circuitry phase margin so that a C-peaking effect in high-frequency band occurs to broaden the bandwidth without sacrificing low-frequency gain. Further, in comparison with L-peaking effect, the added capacitor is far smaller in volume than an inductance to benefit chip area control. Also, a simple method for evaluation the peaking capacitor is provided for designing a wide band transimpedance amplifier instead of selecting an optimum value of capacitance by trial-and-error.

Although, this invention has been described in terms of preferred embodiments, it is apparent that numerous variations and modifications may be made without departing from the true spirit and scope thereof, as set forth in the following claims.

Reference

[1] N. Scheinberg, R. J. Bayruns, and T. M. Laverick, "Monolithic DaAs transimpedance amplifier for fiber-optic receivers", IEEE J. Solid-State Circuit, vol. 26, no.12, pp. 1834–1839, 1991.

[2] J. J. Morikuni, and S. M. Kang, "An analysis of inductive peaking in photoreceiver design", J. Lightwave Technol., vol. 10, pp. 1426–1437, 1992.

[3] A. A. Kwtterson, J. W. Seo, M. H. Tong, K. L. Nummila, J. J. Morikuni, K. Y. Cheng, S. M. Kang, and I. Adesida, "A MODFET-Based optoelectronic integrated circuit receiver for optical interconnects", IEEE Trans. Electron Devices, vol. 40, no. 8, pp. 1406–1416, 1993.

[4] M. Abraham, "Design of Butterworth-type transimpedance and bootstrap-transimpedance preamplifiers for fiber-optic receivers", IEEE Trans. Circuits Syst., vol. Cas-29, no. 6, pp. 375–382, 1982.

[5] K. Honji, T. Sugiura, and H. Itoh, "Ultra-broad-band GaAs momolithic amplifier",IEEE Trans. Microwave Theory Tech., vol. MTT-30, no. 7, pp. 1027–1033, 1982.

[6] E. Bruun, "Feedback analysis of transimpedance operation amplifier circuits", IEEE Trans. Circuit Theory, vol. 40, no. 4, pp. 275–278, 1993.

What is claimed is:

1. A bandwidth enhancement method by adding a peaking capacitor to a transimpedance amplifier for creating peaking effect, comprising:

providing a transimpedance amplifier composed of an inverting amplifier including an inverter having an output, a resistive feedback loop, and an output buffer stage, and a 3-dB bandwidth peaking capacitor added to the transimpedance amplifier parallel with the output of the inverter to ground for creating a 3-dB bandwidth peaking effect in high frequency band to thereby expand and double the bandwidth of the transimpedance amplifier; and, wherein one more pole is available in transfer function than that of a transimpedance amplifier without an extra capacitor; a Q value may be controlled and the bandwidth may be broadened by proper selection of said peaking a capacitor; in case the Q value is greater than 0.5, the correspondent form of said pole is in complex conjugates, and the imaginary parts will be cancelled to broaden the bandwidth; or, if the Q value exceeds to 0.707, a maximum frequency response results; and, the peaking effect occurs when the Q value is greater than 0.707; therefore, the value of Q may be controlled by selecting said peaking capacitor for adjustment of the bandwidth of said transimpedance amplifier.

2. The bandwidth enhancement method by adding a peaking capacitor to a transimpedance amplifier for creating peaking effect according to claim 1, wherein the Q value represents a quality factor of harmonic oscillation frequencies.

* * * * *